US007655995B2

(12) United States Patent
Ohguro

(10) Patent No.: US 7,655,995 B2

(45) Date of Patent: Feb. 2, 2010

(54) SEMICONDUCTOR DEVICE USING MEMS TECHNOLOGY

(75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 388 days.

(21) Appl. No.: 11/341,853

(22) Filed: Jan. 30, 2006

(65) Prior Publication Data

US 2006/0226934 A1 Oct. 12, 2006

(30) Foreign Application Priority Data

Apr. 6, 2005 (JP) ............................ 2005-109977

(51) Int. Cl.
*H01L 27/20* (2006.01)

(52) U.S. Cl. ....................... 257/414; 257/415; 257/416; 257/252; 257/254; 257/E27.006

(58) Field of Classification Search ................. 257/252, 257/254, 414–420, E27.006, E23.013, E29.323, 257/E29.324, E29.325; 310/313 R, 321, 310/322, 323.06

See application file for complete search history.

(56) References Cited

U.S. PATENT DOCUMENTS

| | | | |
|---|---|---|---|
| 4,669,160 A | 6/1987 | Harnden, Jr. et al. | |
| 6,198,208 B1 | 3/2001 | Yano et al. | |
| 6,355,498 B1 | 3/2002 | Chan et al. | |
| 6,359,374 B1 | 3/2002 | Dausch et al. | |
| 6,377,438 B1 | 4/2002 | Deane et al. | |
| 2002/0050882 A1* | 5/2002 | Hyman et al. | 335/78 |
| 2003/0020173 A1* | 1/2003 | Huff et al. | 257/774 |

FOREIGN PATENT DOCUMENTS

JP 2003-117897 A 4/2003

* cited by examiner

*Primary Examiner*—Sue Purvis
*Assistant Examiner*—Leslie Pilar Cruz
(74) *Attorney, Agent, or Firm*—Foley & Lardner LLP

(57) ABSTRACT

A semiconductor device using a MEMS technology according to an example of the present invention comprises a cavity, a lower electrode provided in a lower part of the cavity, an actuator provided in an upper part or inside of the cavity, an upper electrode connected to the actuator, and a conductive layer in contact with the lower electrode outside the cavity via a contact hole whose bottom face is provided above an upper face of the lower electrode in the cavity.

11 Claims, 9 Drawing Sheets

SEMICONDUCTOR DEVICE USING MEMS TECHNOLOGY

CROSS-REFERENCE TO RELATED APPLICATIONS

This application is based upon and claims the benefit of priority from prior Japanese Patent Application No. 2005-109977, filed Apr. 6, 2005, the entire contents of which are incorporated herein by reference.

BACKGROUND OF THE INVENTION

1. Field of the Invention

The present invention relates to a semiconductor device (hereinafter referred to as a MEMS component) using a technology of micro electro mechanical systems (MEMS).

2. Description of the Related Art

A MEMS technology is a technology for applying a semiconductor working technique to minutely make up a movable three-dimensional structure (actuator).

According to the MEMS technology, there is a possibility that a small-sized and high-performance component can be developed which is incomparable to existing components. For example, when fusion of an LSI and an individual component is realized, it is not a dream to remarkably reduce a mounting dimension and largely reduce power consumption.

At present, as MEMS components, mainly, a variable capacity, a switch, an acceleration sensor, a pressure sensor, a radio frequency (RF) filter, a gyroscope, a mirror device and the like have been researched and developed (see, e.g., U.S. Pat. Nos. 6,355,498; 6,359,374; and Jpn. Pat. Appln. KOKAI Publication No. 2003-117897).

However, to put these components into practical use, many problems remain to be solved from aspects of performance and manufacturing cost.

In the aspect of the performance, for example, a movable range of an actuator raises a problem. When the actuator comprises a piezoelectric element, and the actuator is movable only by a piezoelectric force, a problem occurs that the movable range is narrowed. On the other hand, to sufficiently secure the movable range, a high voltage must be applied to the piezoelectric element, and it is difficult to lower a voltage.

In the aspect of manufacturing cost, development of a process technology is a keyword, which is capable of realizing high reliability and yield, while reducing the number of steps. However, a cavity has to be formed in a movable section in which an actuator is formed in the MEMS component.

Therefore, a stepped portion causing a residue is easily generated on a semiconductor substrate. Furthermore, a depth of a contact hole with respect to an electrode of a bottom part of the cavity easily becomes excessively large as compared with a depth of another contact hole.

As a result, processes are required: a chemical mechanical polishing (CMP) process for eliminating the stepped portion; a plurality of photo engraving processes (PEP) and the like. These processes complicate and increase steps, and an increase of the manufacturing cost is caused.

Moreover, when the CMP process is adopted, a problem of dishing has to be considered that a polished material surface has a dish form.

BRIEF SUMMARY OF THE INVENTION

According to an aspect of the present invention, a semiconductor device using a MEMS technology comprises a cavity; a lower electrode provided in a lower part of the cavity; an actuator provided in an upper part or inside of the cavity; an upper electrode connected to the actuator; and a conductive layer brought into contact with the lower electrode outside the cavity via a contact hole whose bottom face is provided above an upper face of the lower electrode in the cavity.

According to an aspect of the present invention, there is provided a manufacturing method of a semiconductor device using a MEMS technology, comprising: forming a groove in an insulating layer; forming a lower electrode which extends from the top of the insulating layer into the groove; filling the groove with a dummy layer; forming on the dummy layer an actuator having an electrode as an input terminal and an upper electrode connected to the actuator; and converting the dummy layer into a cavity.

DETAILED DESCRIPTION OF THE INVENTION

A semiconductor device using a MEMS technology of an aspect of the present invention will be described below in detail with reference to the accompanying drawing.

1. OUTLINE

An example of the present invention is applied to general MEMS components such as a variable capacity, a switch, an acceleration sensor, a pressure sensor, a radio frequency (RF) filter, a gyroscope, and a mirror device.

First, in the example of the present invention, to achieve a drop of manufacturing cost by reduction of the number of steps, there is proposed a technology for simultaneously forming contact holes with respect to a lower electrode and an electrode of an actuator.

For this proposal, from a structural aspect, there is proposed a structure in which a bottom face of the contact hole with respect to the lower electrode is provided above an upper face of the lower electrode in a cavity. From a process aspect, a process is proposed in which after forming a groove in an insulating layer, the lower electrode is formed on the insulating layer and in the groove, so that a depth of the contact hole does not become large with respect to the lower electrode.

It is to be noted that there is not any restriction as to a type of the actuator. For example, actuators of types are usable: a piezoelectric type using a piezoelectric force; an electrostatic type using an electrostatic force; a heat type using deformation by heat; an electromagnetic type using an electromagnetic force and the like.

Moreover, in the example of the present invention, there is provided a technology for setting the actuator to be movable using two forces: a piezoelectric force; and an electrostatic force in order to broaden a movable range of the actuator, accordingly enhance a performance of the MEMS component, and also realize a low voltage.

Therefore, from the structural aspect, a structure is adopted in which the actuator comprises a piezoelectric element, and a distance between a first electrode and the lower electrode increases as these electrodes come close to an upper electrode in a state in which any voltage is not generated between the first and second electrodes of the piezoelectric element. In this case, at a movable time of the actuator, there are simultaneously generated a piezoelectric force by the piezoelectric element and an electrostatic force generated between a conductive layer and the lower electrode.

2. REFERENCE EXAMPLE

Figure 1:
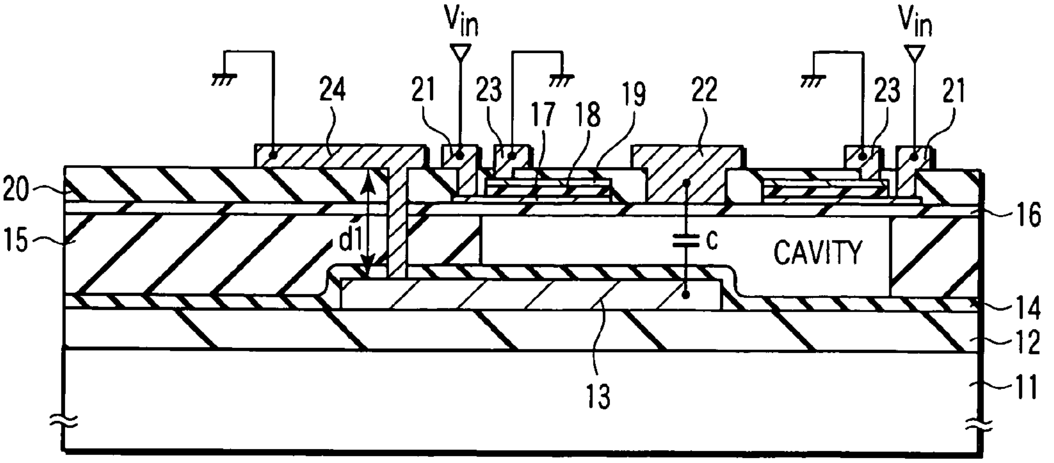
FIG. 1 is a sectional view showing a MEMS component according to a reference example.

FIG. 1 shows a MEMS component according to a reference example.

In this MEMS component, an actuator comprises a piezoelectric element.

An insulating layer 12 is formed on a semiconductor substrate 11. A lower electrode 13 is formed on the insulating layer 12. The lower electrode 13 is coated with an insulating layer 14. An insulating layer 15 having a groove in an upper portion of the lower electrode 13 is formed on the insulating layer 14. On the insulating layer 15, an insulating layer 16 is formed in such a manner as to coat the upper portion of the groove and form the groove into a cavity.

The piezoelectric element is formed as the actuator on the insulating layer 16 on the cavity. The piezoelectric element comprises, for example, first and second electrodes 17, 19, and a piezoelectric layer (e.g., PZT) 18 disposed between the electrodes.

On the insulating layer 16, an insulating layer 20 is formed which coats the piezoelectric element.

In the insulating layer 20, contact holes are disposed which reach the first and second electrodes 17, 19. On the insulating layer 20, conductive layers 21, 23 are formed which are connected to the first and second electrodes 17, 19 via these contact holes.

Moreover, in the insulating layer 20, a contact hole is disposed which reaches the insulating layer 16. On the insulating layer 20, an upper electrode 22 is formed with which the contact hole is filled.

Furthermore, in the insulating layers 14, 15, 16, 20, contact holes are disposed which reach the lower electrode 13. On the insulating layer 20, a conductive layer 24 is formed which is connected to the lower electrode 13 via the contact hole.

Here, for example, when the conductive layers 23, 24 are fixed to a ground potential, and an input signal Vin is supplied to the conductive layer 21, the piezoelectric element deforms in response to with the input signal Vin, and a distance changes between the lower electrode 13 and the upper electrode 22. That is, since a capacity C between the lower electrode 13 and the upper electrode 22 changes in response to the input signal Vin, this MEMS component is usable, for example, as the variable capacity.

However, in this MEMS component, as apparent from the drawings, a depth d1 of the contact hole with respect to the lower electrode 13 is excessively large as compared with a depth of another contact hole. Therefore, it is difficult to form the contact hole with respect to the lower electrode 13 simultaneously with the other contact hole.

Moreover, since the actuator basically deforms only by the piezoelectric force by the piezoelectric element, it is difficult to broaden the movable range without using any high voltage.

3. EMBODIMENTS

Next, several embodiments supposed to be best will be described.

In each embodiment described hereinafter, to clarify differences from the reference example, a MEMS component will be described which is of a type similar to that of the reference example, but this does not mean that all of the examples of the present invention is not limited by the MEMS component of this type.

(1) First Embodiment a. Structure

Figure 2:
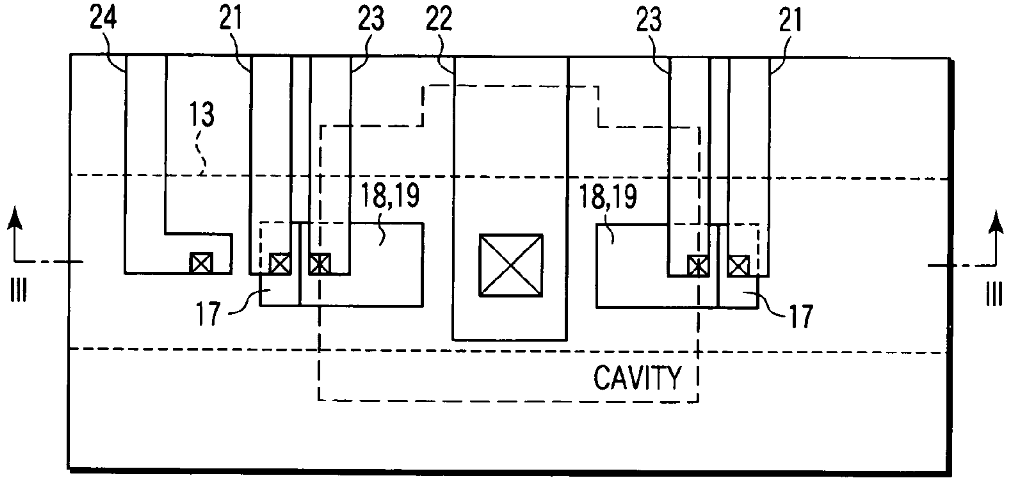
FIG. 2 is a plan view showing a MEMS component according to a first embodiment.
Figure 3:
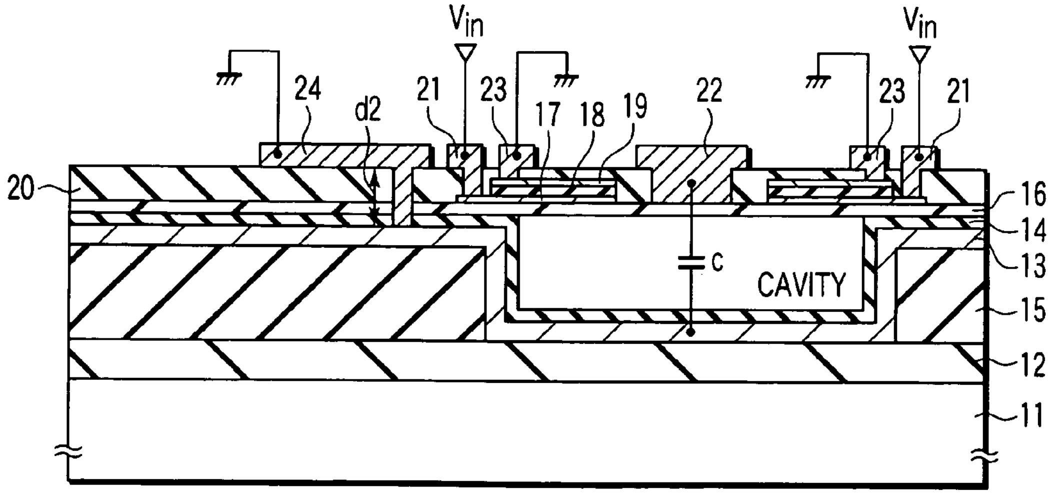
FIG. 3 is a sectional view along a line III-III of FIG. 2.

FIG. 2 shows a MEMS component according to a first embodiment. FIG. 3 is a sectional view along a line III-III of FIG. 2.

A MEMS component of this embodiment is a piezoelectric variable capacity in which an actuator comprises a piezoelectric element in the same manner as in the reference example.

An insulating layer 12 is formed on a semiconductor substrate 11. On the insulating layer 12, an insulating layer 15 having a groove is formed. A lower electrode 13 is formed on the insulating layer 15 and in the groove formed in the insulating layer 15. The lower electrode 13 is coated with an insulating layer 14.

On the insulating layer 15, an insulating layer 16 is formed in such a manner as to cover an upper portion of the groove and form the groove into a cavity. On the insulating layer 16 on the cavity, the piezoelectric element is formed as the actuator. The piezoelectric element comprises, for example, a first electrode 17, a piezoelectric layer 18 on the first electrode 17, and a second electrode 19 on the piezoelectric layer 18. The first and second electrodes 17, 19 function, for example, as input terminals of the MEMS component.

On the insulating layer 16, an insulating layer 20 is formed in such a manner as to coat the piezoelectric element. In the insulating layer 20, contact holes are disposed which reach the first and second electrodes 17, 19. On the insulating layer 20, conductive layers 21, 23 are formed which are connected to the first and second electrodes 17, 19 via these contact holes.

Moreover, in the insulating layer 20, a contact hole is disposed which reaches the insulating layer 16. On the insulating layer 20, an upper electrode 22 is formed in such a manner as to fill the contact hole. The upper electrode 22 functions, for example, as an output terminal of the MEMS component.

Furthermore, in the insulating layers 14, 15, 16, 20, contact holes are disposed which reach the lower electrode 13. On the insulating layer 20, a conductive layer 24 is formed which is connected to the lower electrode 13 via the contact hole.

Here, for example, when the conductive layers 23, 24 are fixed to a ground potential, and an input signal Vin is supplied to the conductive layer 21, the piezoelectric element deforms in response to the input signal Vin, and a distance changes between the lower electrode 13 and the upper electrode 22. That is, since a capacity C between the lower electrode 13 and the upper electrode 22 changes in response to the input signal Vin, this MEMS component is usable, for example, as the variable capacity.

In the present example, the lower electrode 13 is disposed from the top of the insulating layer 15 into the groove. That is, a thick insulating layer 15 is not formed on the lower electrode 13 as in the reference example, and the lower electrode 13 is formed on the thick insulating layer 15.

Therefore, a bottom face of the contact hole reaching the lower electrode 13 is provided on the upper face of the lower electrode 13 in the cavity.

As a result, as apparent from the drawings, a depth d2 of the contact hole with respect to the lower electrode 13 is substantially equal to a depth of another contact hole. Therefore, it is possible to form the contact hole with respect to the lower electrode 13 simultaneously with the other contact hole.

b. Material, Size and the Like

Next, an example of a material, size or the like will be described for use in the MEMS components of FIGS. 2 and 3.

As the semiconductor substrate 11, a material can be selected, for example, from true semiconductors such as Si, Ge, compound semiconductors such as GaAs, ZnSe, and highly conductive semiconductors obtained by doping these semiconductors with impurities. The semiconductor substrate 11 may be a silicon on insulator (SOI) substrate.

The insulating layer 12 is formed of, for example, silicon oxide. The insulating layer 12 has a thickness of 3 nm or more, preferably 400 nm or more.

As the lower electrode 13 and the upper electrode 22, a material is selectable from metals such as W, Al, Cu, Au, Ti and Pt, an alloy containing at least one of these metals, and a conductive polysilicon containing impurities. The lower electrode 13 and the upper electrode 22 may have a single-layer structure or a stacked structure.

When the impurities-containing conductive polysilicon is used as the lower electrode 13 and the upper electrode 22, silicide is preferably formed on the conductive polysilicon in order to lower a resistance. The lower electrode 13 and the upper electrode 22 may contain elements such as Co, Ni, Si, N.

The lower electrode 13 and the upper electrode 22 may comprise the same structure or material, or mutually different structures or materials.

Flat shapes of the lower electrode 13 and the upper electrode 22 are not especially limited. For example, shapes are usable such as a square shape, rectangular shape, circular shape, and polygonal shape.

As the piezoelectric layer 18 of the piezoelectric element constituting the actuator, a material is selectable from ceramics such as PZT($Pb(Zr,Ti)O_3$), AlN, ZnO, PbTiO and BTO ($BaTiO_3$), and polymeric materials such as polyvinylidene fluoride (PVDF).

The first and second electrodes 17, 19 of the piezoelectric element constituting the actuator can comprise, for example, the following materials:

metals such as Pt, Sr, Ru, Cr, Mo, W, Ti, Ta, Al, Cu and Ni, or an alloy containing at least one of these metals;

a nitride, an oxide (ex. SrRuO), or a compound of the above a.; and stacked layers of a plurality of materials selected from the above a. and b.

The first and second electrodes 17, 19 may comprise the same structure or material, or mutually different structures or materials.

A thickness of the piezoelectric element which is the actuator is as thin as possible, and set to, for example, 0.2 nm or less. The flat shapes of the piezoelectric element are not especially limited. For example, a square shape, rectangular shape, circular shape, polygonal shape and the like are usable.

The insulating layers 14, 16 comprise, for example, silicon nitride. The insulating layers 15, 20 comprise, for example, silicon oxide.

The thickness of the insulating layer 15 determines a size of the cavity, that is, a movable range of the actuator. The thickness of the insulating layer 15 is set, for example, to 600 nm or more.

The conductive layers 21, 23, 24 comprise, for example, the same structure and material as those of the upper electrode 22.

A plurality of MEMS components of the first embodiment are formed on a wafer, and are separated from one another by dicing. As to a size of one chip, a quadrangular shape has a size of about 2 cm×2 cm or less, for example, in a discrete product in which the MEMS component only is formed in the chip.

Here, the cavity is preferably sealed in order to prevent element destruction by a hydraulic pressure at the time of dicing.

There is not any restriction as to an air pressure of the cavity, and a gas with which the cavity is filled. For example, the air pressure of the cavity may be an atmospheric pressure, or a state close to vacuum. The gas with which the cavity is filled may be mainly a carbon gas or the same component as the atmosphere.

A flat shape of the cavity is selectable, for example, from a square shape, rectangular shape, circular shape, polygonal shape and the like.

c. Operation

Next, an operation of the MEMS component of FIGS. 2 and 3 will be described.

When this MEMS component is operated, the semiconductor substrate 11 is preferably fixed, for example, to a ground potential.

In an initial state in which any voltage is applied to the piezoelectric element constituting the actuator, that is, when the input signal Vin indicates 0V, any voltage is not applied to the piezoelectric element, and therefore a distance is longest between the lower electrode 13 and the upper electrode 22. A capacity C at this time is set as Cmin.

When the input signal Vin is raised, for example, to a value of 0V or more. A deformation amount of the piezoelectric element increases in accordance with the value, and the distance gradually decreases between the lower electrode 13 and the upper electrode 22. Since the capacity C between the lower electrode 13 and the upper electrode 22 is inversely proportional to the distance between both the electrodes, the capacity C gradually increases in accordance with the increase of the input signal Vin.

For example, when the input signal Vin indicates 0V, a capacity Cmin is set to about 0.08 pF. Then, when the input signal Vin is set to 3V (maximum value), a capacity Cmax is about 13 pF. Additionally, the upper electrode 22 has a circular shape having a diameter of 100 μm. In the initial state, a distance is set to 1 μm between the lower electrode 13 and the upper electrode 22.

It is to be noted that a maximum value of the input signal Vin is preferably set to 3V or less in order to lower the voltage, and a capacity ratio (Cmax/Cmin) at this time is preferably 20 or more on an operation condition of −45° C. to 125° C.

d. Conclusions

As described above, in the MEMS component of the first embodiment, the lower electrode is formed from the top of the thick insulating layer into the groove. As a result, the bottom face of the contact hole with respect to the lower electrode is provided above the upper face of the lower electrode in the cavity. Therefore, the contact hole with respect to the lower electrode can be formed simultaneously with the other contact holes, and the reduction of the manufacturing cost can be realized by the reduction of the number of steps (PEP number).

(2) Second Embodiment a. Structure

Figure 4:
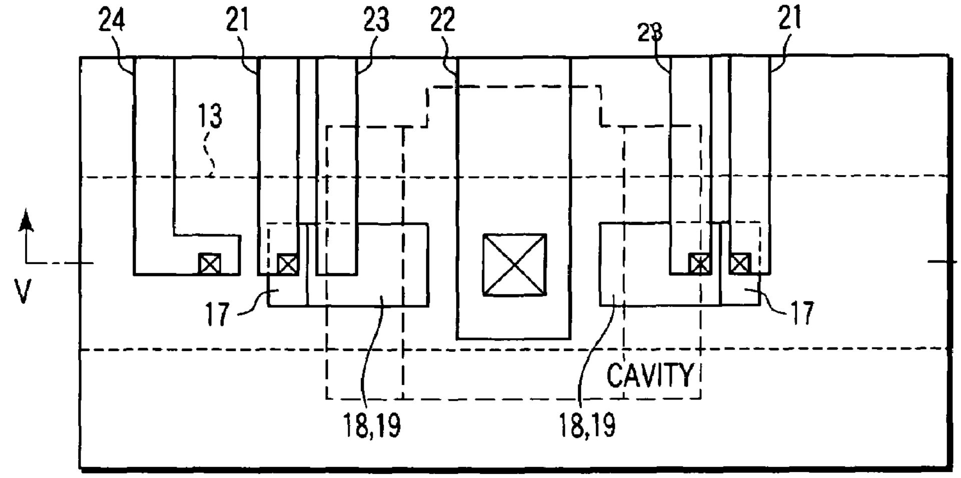
FIG. 4 is a plan view showing a MEMS component according to a second embodiment.
Figure 5:
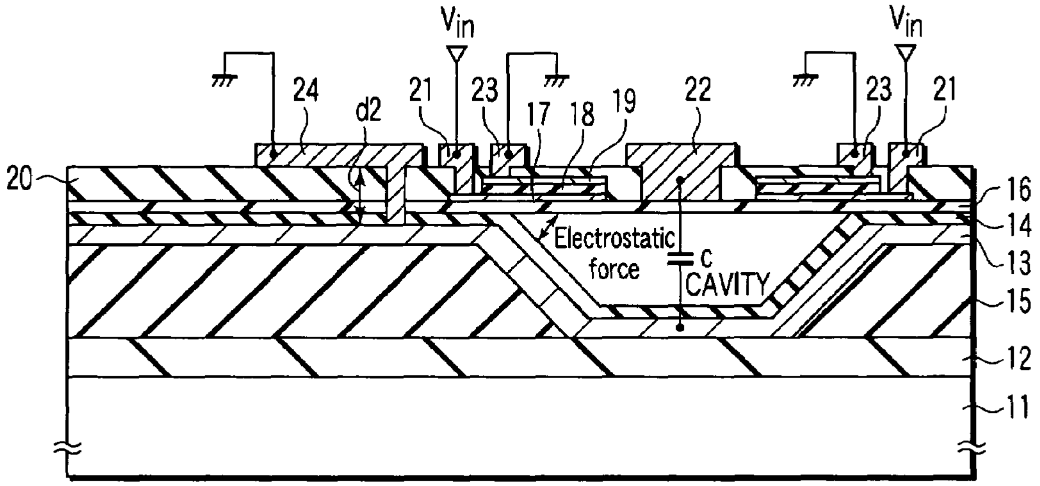
FIG. 5 is a sectional view along a line V-V of FIG. 4.

FIG. 4 shows a MEMS component according to a second embodiment. FIG. 5 is a sectional view along a line V-V of FIG. 4.

This MEMS component is also a piezoelectric variable capacity in which an actuator comprises a piezoelectric element in the same manner as in the reference example.

An insulating layer 12 is formed on a semiconductor substrate 11. On the insulating layer 12, an insulating layer 15 having a groove is formed. A lower electrode 13 is formed on the insulating layer 15 and in the groove formed in the insulating layer 15. The lower electrode 13 is coated with an insulating layer 14.

On the insulating layer 15, an insulating layer 16 is formed in such a manner as to cover an upper portion of the groove and form the groove into a cavity. On the insulating layer 16 on the cavity, the piezoelectric element is formed as the actuator. The piezoelectric element comprises, for example, a first electrode 17, a piezoelectric layer 18 on the first electrode 17, and a second electrode 19 on the piezoelectric layer 18. The first and second electrodes 17, 19 function, for example, as input terminals of the MEMS component.

On the insulating layer 16, an insulating layer 20 is formed in such a manner as to coat the piezoelectric element. In the insulating layer 20, contact holes are disposed which reach the first and second electrodes 17, 19. On the insulating layer 20, conductive layers 21, 23 are formed which are connected to the first and second electrodes 17, 19 via these contact holes.

Moreover, in the insulating layer 20, a contact hole is disposed which reaches the insulating layer 16. On the insulating layer 20, an upper electrode 22 is formed in such a manner as to fill the contact hole. The upper electrode 22 functions, for example, as an output terminal of the MEMS component.

Furthermore, in the insulating layers 14, 15, 16, 20, contact holes are disposed which reach the lower electrode 13. On the insulating layer 20, a conductive layer 24 is formed which is connected to the lower electrode 13 via the contact hole.

Here, for example, when the conductive layers 23, 24 are fixed to a ground potential, and an input signal Vin is supplied to the conductive layer 21, the piezoelectric element deforms in response to the input signal Vin, and a distance changes between the lower electrode 13 and the upper electrode 22. That is, since a capacity C between the lower electrode 13 and the upper electrode 22 changes in response to the input signal Vin, this MEMS component is usable, for example, as the variable capacity.

In the MEMS component of the present example, in an initial state in which any voltage is not supplied to the piezoelectric element constituting the actuator, that is, when the input signal Vin indicates 0V, a distance between the first electrode 17 and the lower electrode 13 of the piezoelectric element to which the input signal Vin is applied increases as these electrodes come close to the upper electrode 22.

For example, as shown in FIG. 5, a side face of the groove formed in the insulating layer 15 is partially or entirely tapered. The taper is preferably formed right under the piezoelectric element constituting the actuator.

Accordingly, since the actuator is movable using a piezoelectric force by the piezoelectric element and an electrostatic force between the first electrode 17 and the lower electrode 13, a movable range of the actuator is broadened without raising the voltage, and high performance of the MEMS component can be realized.

It is to be noted that the electrostatic force increases in inverse proportion to a square of a distance, for example, when the upper electrode 22 approaches the lower electrode 13 by contraction of the piezoelectric element, and a distance shortens between the first electrode 17 and the lower electrode 13 of the piezoelectric element.

Moreover, the taper can be easily formed, for example, adjusting etching conditions of the insulating layer 15 at a time when the groove is formed. This respect will be described in detail in description of a manufacturing method.

b. Material, Size and the Like

As to a material, size and the like for use in the MEMS component of the second embodiment, the examples of the material, size and the like described in the first embodiment are applicable as they are.

Also in the MEMS component of the second embodiment, a plurality of components are formed on a wafer and separated from one another by dicing in the same manner as in the first embodiment.

Therefore, the cavity is preferably sealed. It can be said that an air pressure of the cavity and a gas filled in the cavity are the same as those of the first embodiment. As a flat shape of the cavity, for example, a square shape, rectangular shape, circular shape, polygonal shape and the like are usable.

c. Operation

An operation of the MEMS component of the second embodiment is the same as that described in the first embodiment.

Additionally, since the actuator is movable using piezoelectric and electrostatic forces in the second embodiment, an operation is possible at a voltage which is lower than that of the first embodiment.

d. Conclusions

As described above, in the MEMS component of the second embodiment, in the initial state, the distance between the first electrode and the lower electrode of the piezoelectric element to which the input signal Vin is applied increases as these electrodes come close to the upper electrode. Therefore, the actuator is movable using the piezoelectric force by the piezoelectric element and the electrostatic force generated between the conductive layer and the lower electrode. Without raising the voltage, the movable range of the actuator can be broadened, and the high performance of the MEMS component can be realized.

e. Others

In the second embodiment, the bottom face of the contact hole with respect to the lower electrode 13 is provided above the upper face of the lower electrode 13 in the cavity. That is, the MEMS component of the second embodiment include all the characteristics of the first embodiment, and an effect similar to that of the first embodiment can be obtained.

It is to be noted that in the second embodiment, it is necessary to adjust a taper position and angle with respect to the surface of the semiconductor substrate and the like in such a manner that the taper does not restrict the movable range of the actuator.

(3) Third Embodiment

A third embodiment is a modification of the second embodiment. Characteristics lie in that the side face of the groove is provided with not a taper shape but a stairs shape.

a. Structure

Figure 6:
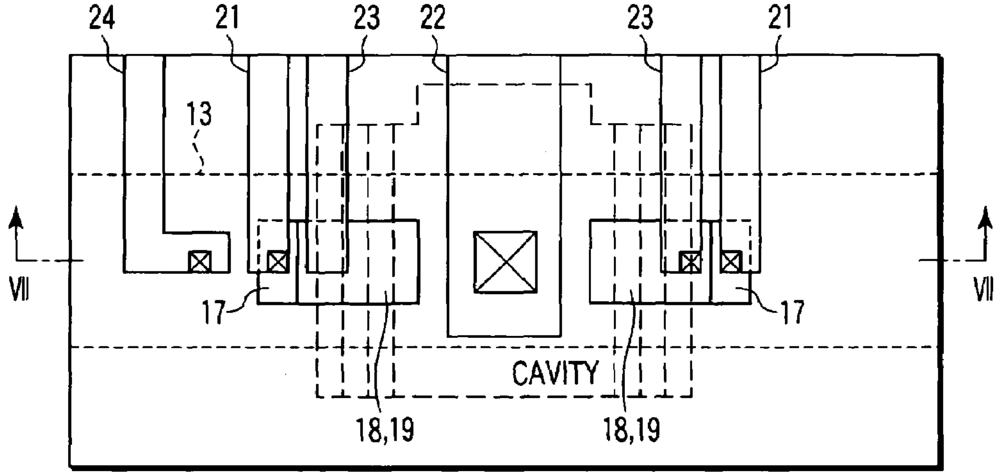
FIG. 6 is a plan view showing a MEMS component according to a third embodiment.
Figure 7:
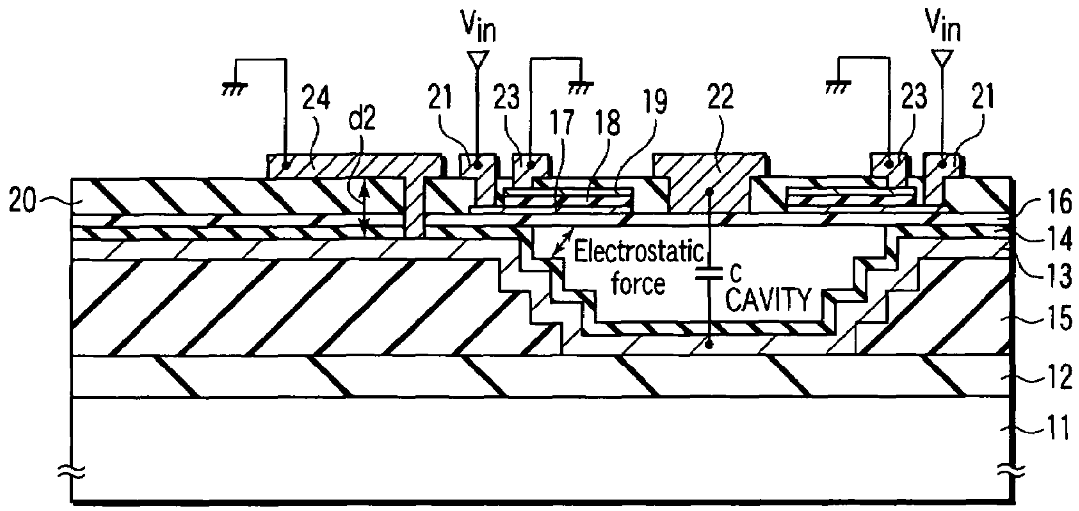
FIG. 7 is a sectional view along a line VII-VII of FIG. 6.

FIG. 6 shows a MEMS component according to the third embodiment. FIG. 7 is a sectional view along a line VII-VII of FIG. 6.

The structure of the MEMS component according to the third embodiment is the same as that according to the second embodiment except the side face of the groove.

In an initial state in which any voltage is not supplied to the piezoelectric element constituting the actuator, that is, when the input signal Vin indicates 0V, a distance between the first electrode 17 and the lower electrode 13 of the piezoelectric element to which the input signal Vin is applied increases as these electrodes come close to the upper electrode 22.

Figure 8:
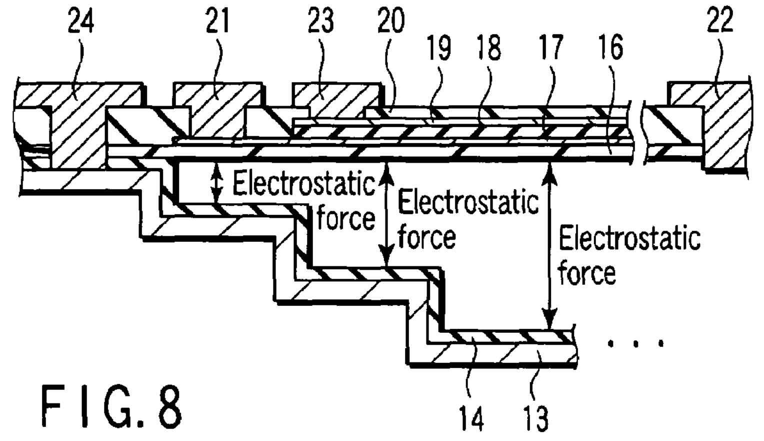
FIG. 8 is a sectional view showing a cavity portion of the MEMS component of FIG. 6.

In the present embodiment, as shown in FIGS. 6 and 7, the side face of the groove formed in the insulating layer 15 is partially or entirely tapered. In this case, as shown in FIG. 8, in the initial state in which any voltage is not applied to the piezoelectric element constituting the actuator, that is, at the input signal Vin of 0V, the distance between the first electrode 17 and the lower electrode 13 increases as these electrodes come close to the upper electrode 22.

It is to be noted that the stairs portion is preferably formed right under the piezoelectric element constituting the actuator.

Accordingly, since the actuator is movable using a piezoelectric force by the piezoelectric element and an electrostatic force generated between the first electrode 17 and the lower electrode 13, a movable range of the actuator is broadened without raising the voltage, and high performance of the MEMS component can be realized.

b. Material, Size and the Like

As to a material, size and the like for use in the MEMS component of the third embodiment, the examples of the material, size and the like described in the first embodiment are applicable as they are.

Also in the MEMS component of the third embodiment, a plurality of components are formed on a wafer and separated from one another by dicing in the same manner as in the first embodiment.

Therefore, the cavity is preferably sealed. It can be said that an air pressure of the cavity and a gas filled in the cavity are the same as those of the first embodiment. As a flat shape of the cavity, for example, a square shape, rectangular shape, circular shape, polygonal shape and the like are usable.

c. Operation

An operation of the MEMS component of the third embodiment is the same as that described in the first embodiment. Here, the description is omitted.

Additionally, since the actuator is movable using piezoelectric and electrostatic forces also in the third embodiment, an operation is possible at a voltage which is lower than that of the first embodiment.

d. Conclusions

As described above, even in the third embodiment, an effect similar to that of the second embodiment can be obtained.

e. Others

The MEMS component of the third embodiment also include all of the characteristics of the first embodiment, and an effect similar to that of the first embodiment can be obtained. It is to be noted that in the third embodiment, it is necessary to adjust a position and the like of the stairs portion in such a manner that the stairs portion does not restrict the movable range of the actuator.

(4) Fourth Embodiment

Figure 9:
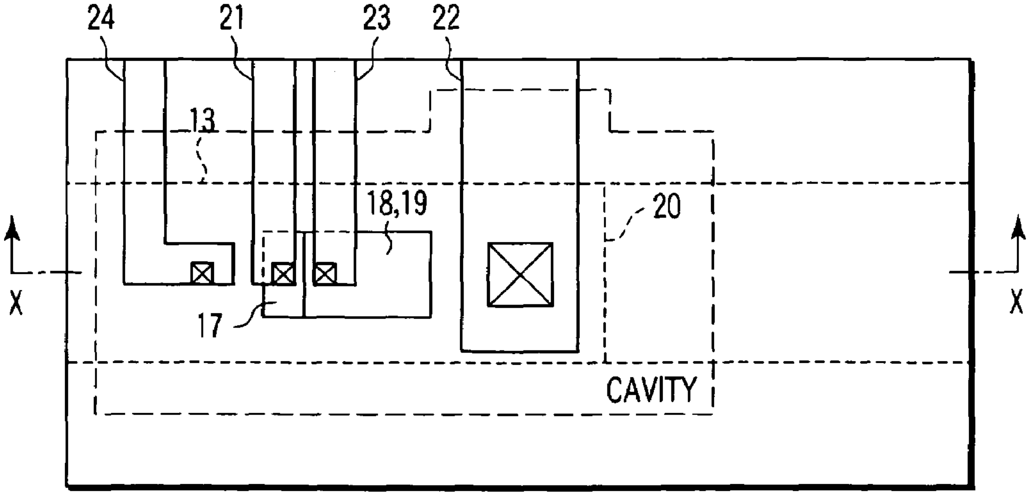
FIG. 9 is a plan view showing a MEMS component according to a fourth embodiment.
Figure 10:
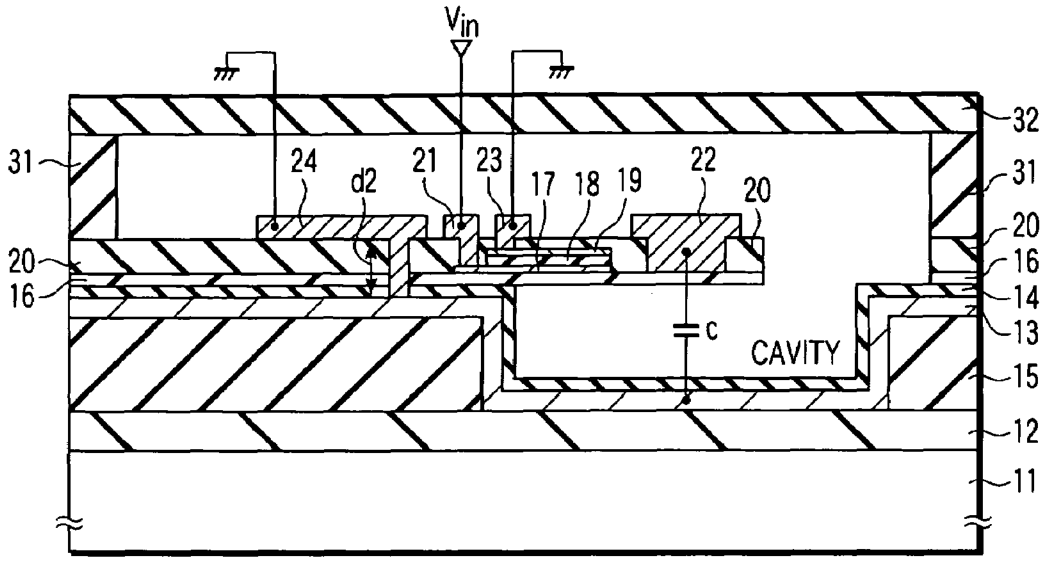
FIG. 10 is a sectional view along a line X-X of FIG. 9.
Figure 11:
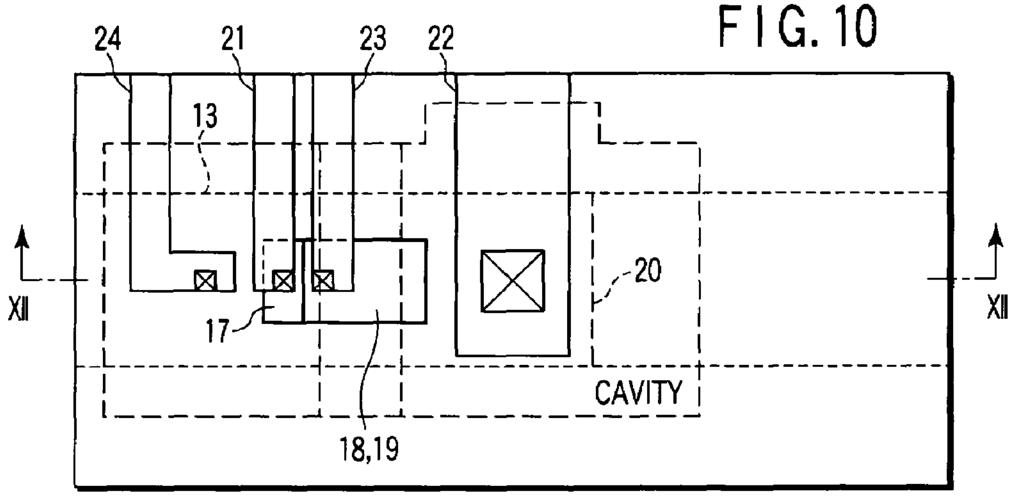
FIG. 11 is a plan view showing a MEMS component according to the fourth embodiment.
Figure 12:
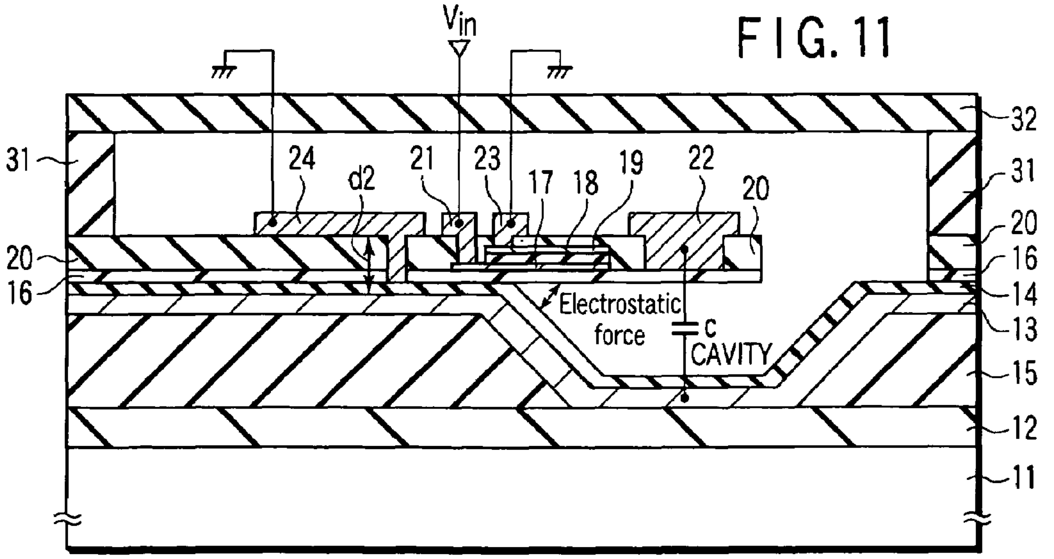
FIG. 12 is a sectional view along a line XII-XII of FIG. 11.
Figure 13:
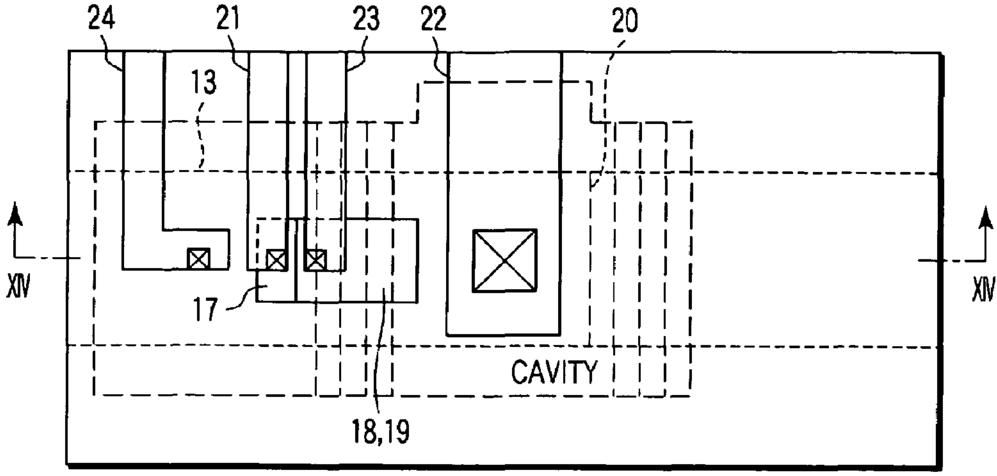
FIG. 13 is a plan view showing a MEMS component according to the fourth embodiment.
Figure 14:
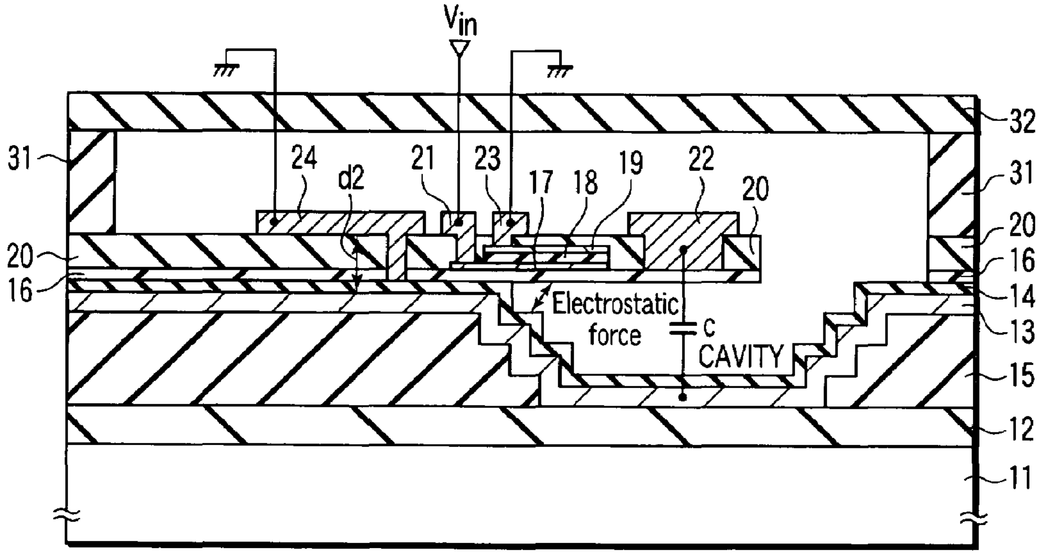
FIG. 14 is a sectional view along a line XIV-XIV of FIG. 13.

FIGS. 9 to 14 show a MEMS component according to a fourth embodiment. FIGS. 9 and 10 correspond to a modification of the first embodiment, FIGS. 11 and 12 correspond to a modification of the second embodiment, and FIGS. 13 and 14 correspond to a modification of the third embodiment.

An insulating layer 12 is formed on a semiconductor substrate 11. On the insulating layer 12, an insulating layer 15 having a groove is formed. A lower electrode 13 is formed on the insulating layer 15 and in the groove formed in the insulating layer 15. The lower electrode 13 is coated with an insulating layer 14.

On the insulating layer 15, an insulating layer 16 is formed in such a manner as to coat an upper portion of the groove. On the insulating layer 16, the piezoelectric element is formed as the actuator. The piezoelectric element comprises, for example, a first electrode 17, a piezoelectric layer 18 on the first electrode 17, and a second electrode 19 on the piezoelectric layer 18. The first and second electrodes 17, 19 function, for example, as input terminals of the MEMS component.

On the insulating layer 16, an insulating layer 20 is formed in such a manner as to coat the piezoelectric element. In the insulating layer 20, contact holes are disposed which reach the first and second electrodes 17, 19. On the insulating layer 20, conductive layers 21, 23 are formed which are connected to the first and second electrodes 17, 19 via these contact holes.

Moreover, in the insulating layer 20, a contact hole is disposed which reaches the insulating layer 16. On the insulating layer 20, an upper electrode 22 is formed in such a manner as to fill the contact hole. The upper electrode 22 functions, for example, as an output terminal of the MEMS component.

Furthermore, in the insulating layers 14, 15, 16, 20, contact holes are disposed which reach the lower electrode 13. On the insulating layer 20, a conductive layer 24 is formed which is connected to the lower electrode 13 via the contact hole.

On the insulating layer 20, insulating layers 31, 32 are formed in such a manner as to surround the actuator. As a result, a cavity is formed around the actuator.

It is to be noted that instead of the insulating layers 31, 32, another wafer may be used to form a cavity by a wafer level package.

Here, for example, when the conductive layers 23, 24 are fixed to a ground potential, and the input signal Vin is supplied to the conductive layer 21, the piezoelectric element deforms in response to the input signal Vin, and a distance changes between the lower electrode 13 and the upper electrode 22. That is, since a capacity C between the lower electrode 13 and the upper electrode 22 changes in response to the input signal Vin, this MEMS component is usable, for example, as the variable capacity.

b. Material, Size and the Like

As to a material, size and the like for use in the MEMS component of the fourth embodiment, the examples of the material, size and the like described in the first embodiment are applicable as they are.

Also in the MEMS component of the fourth embodiment, a plurality of components are formed on a wafer and separated from one another by dicing in the same manner as in the first embodiment.

Therefore, the cavity is preferably sealed. It can be said that an air pressure of the cavity and a gas filled in the cavity are the same as those of the first embodiment. As a flat shape of the cavity, for example, a square shape, rectangular shape, circular shape, polygonal shape and the like are usable.

c. Operation

An operation of the MEMS component of the fourth embodiment is the same as that described in the first embodiment. Here, the description is omitted.

d. Conclusions

As described above, even in the fourth embodiment, effects similar to that of the first to third embodiments can be obtained.

(5) Others

In the first to fourth embodiments, an input signal Vin is applied to the first electrode of the piezoelectric element, and the second electrode is fixed to a ground potential. In this case, for example, when a positive voltage is applied as the input signal Vin, the actuator moves in one direction (direction approaching the lower electrode).

Instead of this constitution, the actuator is moved from an initial state in one direction (approaching the lower electrode) or another direction (leaving the lower electrode), and a movable range can be broadened.

For example, when the input signal Vin changes in a range from a negative voltage (e.g., –3V) to a positive voltage (e.g., 3V), the actuator can be moved from the initial state in one or the other direction. When the positive voltage only is used as the input signal Vin, and different input signals Vin are applied to both the first and second electrodes of the piezoelectric element, and the movable range of the actuator can be broadened.

Moreover, as to the MEMS components of the first to fourth embodiments, for example, when the component is used as a switch, the lower and upper electrodes have to be exposed in the cavity. Therefore, in this case, deformation is required such as an opening disposed in the insulating layer.

4. MANUFACTURING METHOD

Next, a manufacturing method of a MEMS component will be described according to an example of the present invention.

Here, the method will be described in accordance with an example of the MEMS component of the second embodiment.

Figure 15:
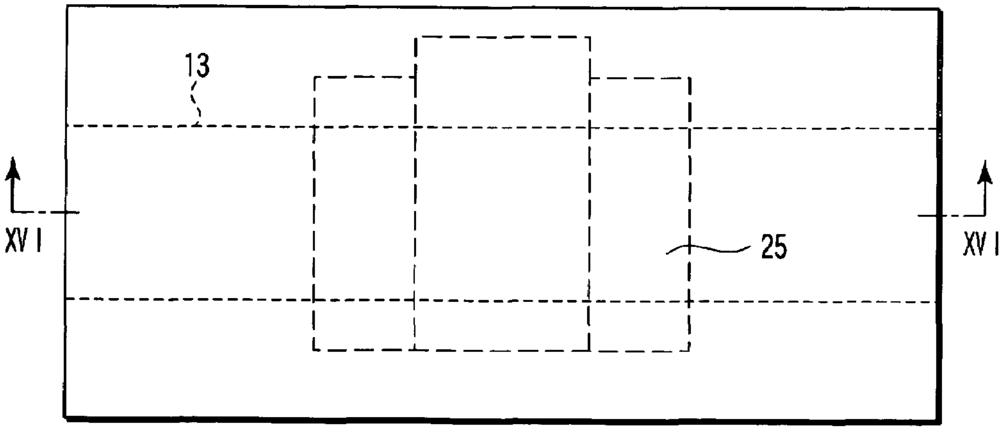
FIG. 15 is a plan view showing one step of a manufacturing method according to an example of the present invention.
Figure 16:
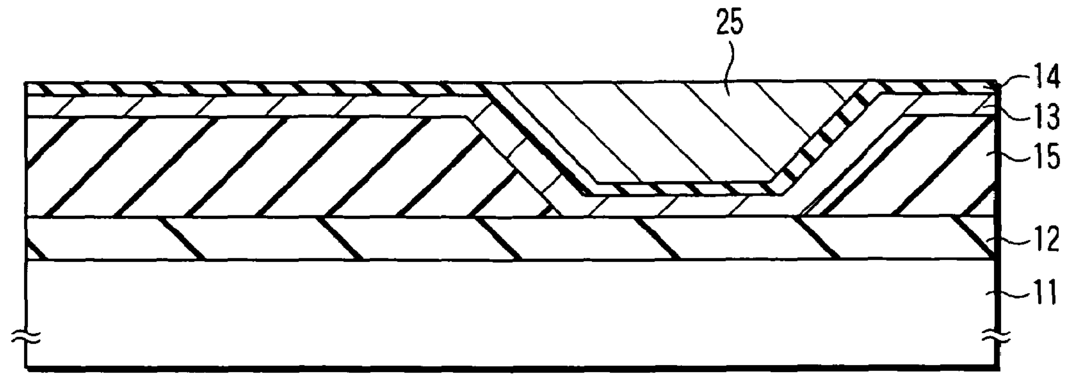
FIG. 16 is a sectional view along a line XVI-XVI of FIG. 15.

First, as shown in FIGS. 15 and 16, an insulating layer (e.g., silicon oxide) 12 having a thickness of about 1.3 μm is formed on a semiconductor substrate 11 using a thermal oxidation process. An insulating layer (e.g., silicon oxide) 15 having a thickness of about 1 μm is formed on the insulating layer 12 using a chemical vapor deposition (CVD) process.

Next, a groove is formed in the insulating layer 15 by a photo engraving process (PEP). That is, a resist pattern is formed on the insulating layer 15, and the insulating layer 15 is etched by chemical dry etching (CDE) using this resist pattern as a mask. The CDE is one type of isotropic etching, and a taper is formed on the side face of the groove. Thereafter, the resist pattern is removed.

It is to be noted that when the side face of the groove may be vertical to the surface of the semiconductor substrate 11 as in the first embodiment, anisotropic etching such as reactive ion etching (RIE) is used as an etching process of the insulating layer 15.

Moreover, when the side face of the groove has a stairs shape as in the third embodiment, formation/removal of the resist pattern and RIE may be repeated a plurality of times.

Next, a conductive layer 13 is formed on the insulating layer 15 and in the groove, and the conductive layer 13 is patterned by the PEP, and form into the lower electrode 13. An insulating layer (e.g., silicon nitride) 14 having a thickness of about 50 nm is formed using a CVD process in such a manner as to coat the lower electrode 13.

Moreover, a dummy layer (e.g., polysilicon) 25 is formed on the insulating layer 14 using the CVD process in such a manner that the groove is completely filled. Thereafter, the dummy layer 25 is polished by chemical mechanical polishing (CMP), the dummy layer 25 is left only in the groove, and the surface is flatted.

Figure 17:
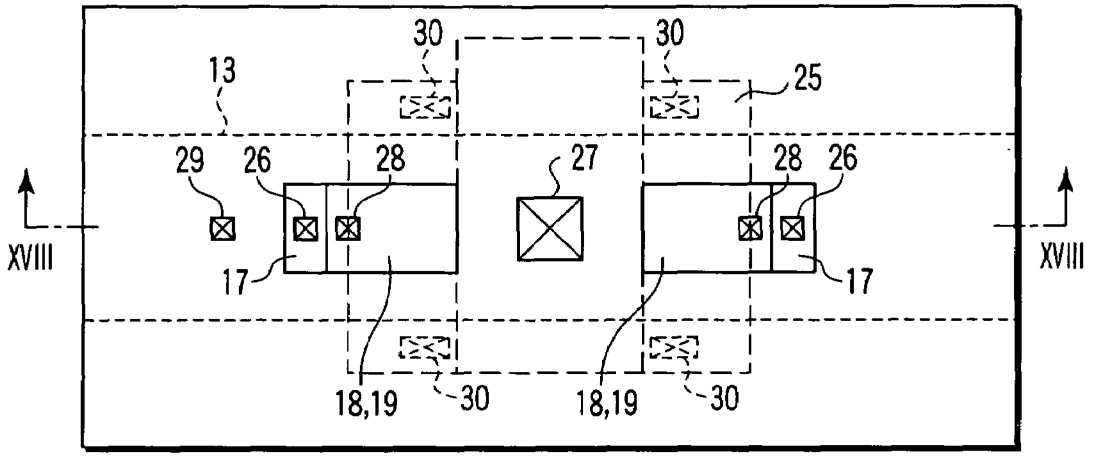
FIG. 17 is a plan view showing one step of the manufacturing method according to an example of the present invention.
Figure 18:
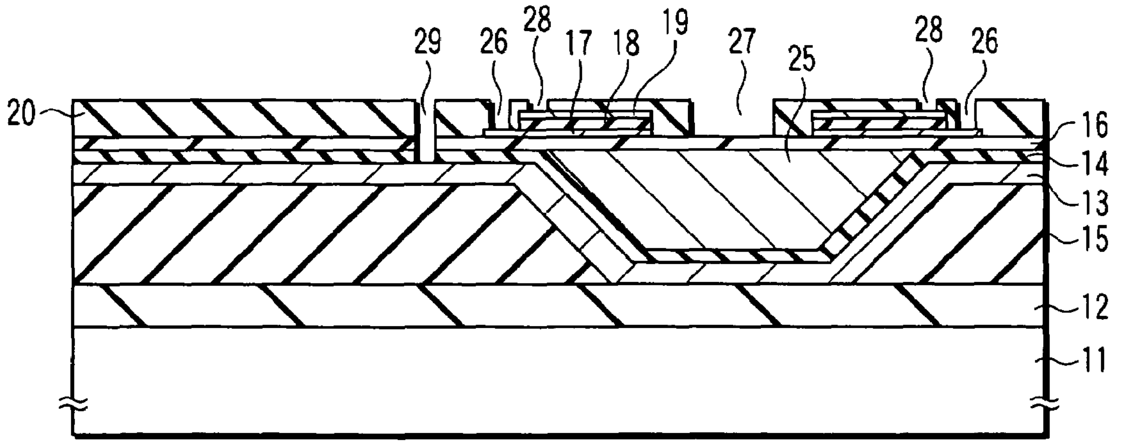
FIG. 18 is a sectional view along a line XVIII-XVIII of FIG. 17.

Next, as shown in FIGS. 17 and 18, since an insulating layer (e.g., silicon nitride) 16 having a thickness of about 50 nm is formed on the insulating layer 14 and the dummy layer 25 using the CVD process, the surface of the insulating layer 16 is also flat.

Moreover, the piezoelectric element is formed as the actuator on the flat insulating layer 16. For example, the first electrode 17, piezoelectric layer 18, and second electrode 19 are successively deposited, and patterned to thereby form the piezoelectric element.

It is to be noted that since the piezoelectric element is formed on the flat insulating layer 16, fluctuations of characteristics can be reduce, and this can contribute to enhancement of reliability of the MEMS component.

Next, by the use of the CVD process, an insulating layer (e.g., silicon oxide) 20 having a thickness of about 100 nm is formed on the insulating layer 16 in such a manner as to completely coat the piezoelectric element.

Moreover, by the PEP, contact holes 26, 27, 28 are formed in the insulating layer 20, and a contact hole 29 is formed in the insulating layers 14, 16, 20.

The contact hole 26 reaches the first electrode 17 of the piezoelectric element, the contact hole 27 reaches the second electrode 19 of the piezoelectric element, and the contact hole 27 reaches the insulating layer 16. The contact hole 29 reaches the lower electrode 13 existing on the insulating layer 15.

Here, these contact holes 26, 27, 28, 29 are simultaneously formed once by PEP and RIE.

Moreover, the dummy layer 25 is removed to form in the insulating layer 16 a hole 30 for forming a cavity. This hole 30 can be formed simultaneously with the contact holes 26, 27, 28, 29.

The holes 30 for removing the dummy layer 25 are disposed, for example, in several end portions of the groove. A shape of the hole 30 is not especially limited, and a shape of circle, ellipse, rectangle, quadrangle, or polygon is usable.

Thereafter, the dummy layer 25 is removed using a chemical or a reactive gas to form a cavity in such a manner that the actuator is movable.

It is to be noted that when the dummy layer 25 comprises a resist, the dummy layer 25 can be removed by an evaporating process referred to as ashing.

Figure 19:
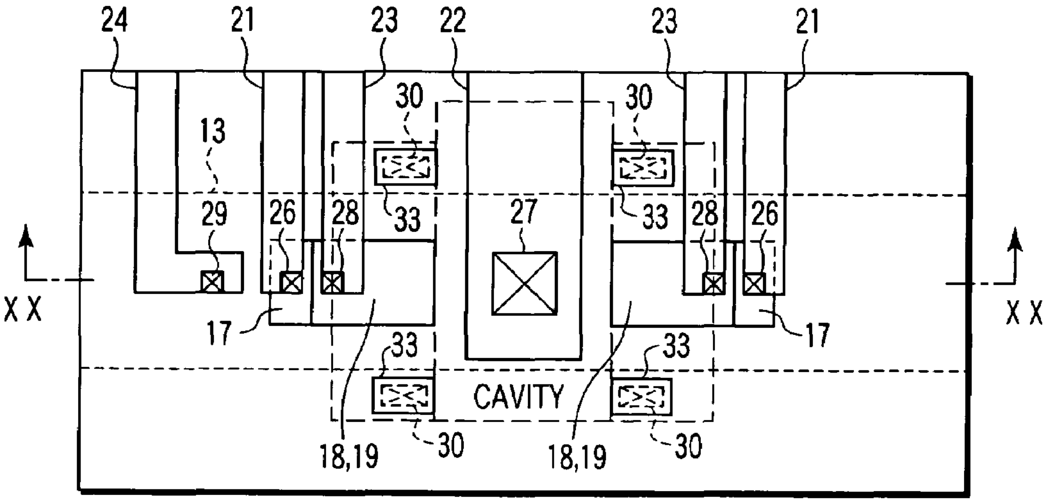
FIG. 19 is a plan view showing one step of the manufacturing method according to an example of the present invention.
Figure 20:
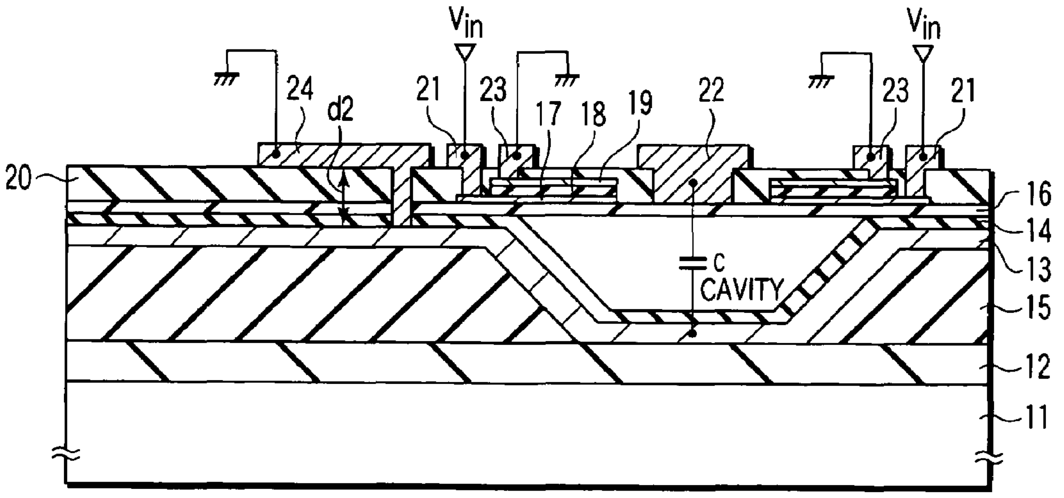
FIG. 20 is a sectional view along a line XX-XX of FIG. 19.

Next, as shown in FIGS. 19 and 20, after a conductive layer is formed on the insulating layer 20 in such a manner as to fill in the contact holes 26, 27, 28, 29 by the CVD process, this conductive layer is patterned by the PEP to form the conductive layers 21, 23, 24 constituting the electrodes and the upper electrode 22.

Moreover, at this time, the hole 30 for removing the dummy layer 25 may be closed by a conductive layer 33 to seal a cavity.

It is to be noted that the cavity may be closed by semiconductors such as Si, SiGe instead of the conductive layer 33.

The MEMS component according to the second embodiment is completed by the above-described steps.

According to this manufacturing method, after forming the groove in the thick insulating layer 15, the conductive layer 13 is formed as the lower electrode which extends from the top of the insulating layer 15 into the groove.

Therefore, when the contact hole 29 with respect to the lower electrode 13 is disposed in the upper portion of the insulating layer 15, a depth d2 of the contact hole 29 can be reduced, and the contact holes 26, 27, 28, 29 can be formed simultaneously.

Moreover, when the taper is formed on the side face of the groove by isotropic etching such as CDE, it is possible to easily obtain a structure in which the actuator is movable by the electrostatic force in addition to the piezoelectric force by the piezoelectric element.

As described above, the MEMS component can be actually manufactured which is capable of realizing the enhancement of the performance and the reduction of the manufacturing cost simultaneously.

It is to be noted that in the above-described manufacturing method, as the material constituting the dummy layer 25 for use in forming the cavity, in addition to the polysilicon, silicon materials such as amorphous silicon, organic materials such as resist and the like are usable.

5. APPLICATION EXAMPLE

When the example of the present invention is applied to general MEMS components such as a variable capacity, a switch, an acceleration sensor, a pressure sensor, an RF filter, a gyroscope, and a mirror device, enhancement of performance and reduction of manufacturing cost can be realized simultaneously with respect to the MEMS component.

Moreover, the example of the present invention is applicable to a discrete product in which the MEMS component only is formed in one chip. Additionally, the example is applied, for example, to a system LSI on which the MEMS component and LSI (logic circuit, memory circuit, etc.) are mixed/mounted in one chip, and high performance of the system LSI and reduction of a mounting dimension can be realized.

Figure 21:
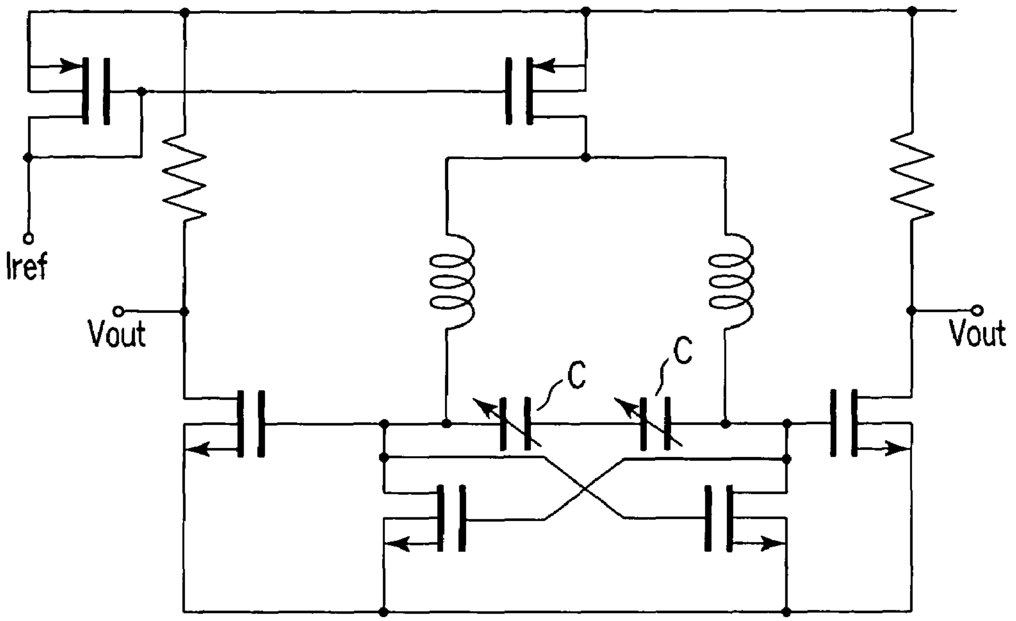
FIG. 21 is a circuit diagram showing an example of VCO.

For example, the example of the present invention is applicable as a variable capacity C of a voltage controlled oscillator (VCO) shown in FIG. 21 for use in portable apparatuses such as a cellular phone and communication apparatuses such as radio LAN.

Figure 22:
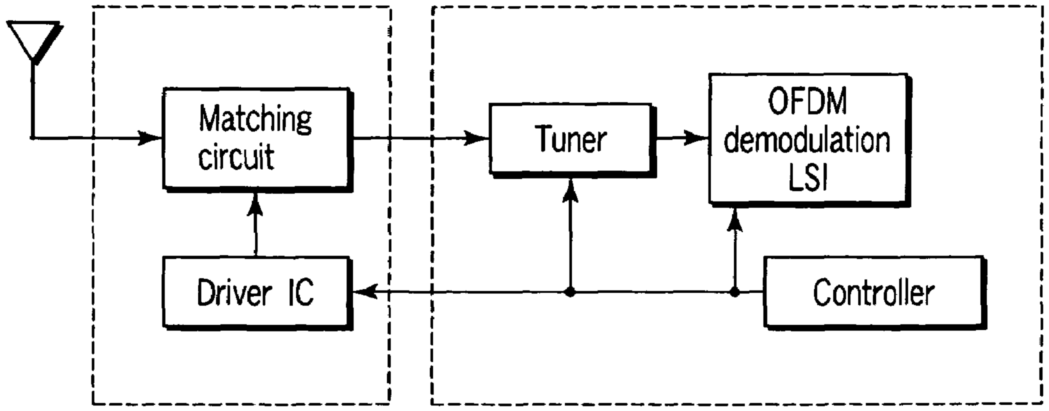
FIG. 22 is a block diagram showing an example of a transmission/reception unit.
Figure 23:
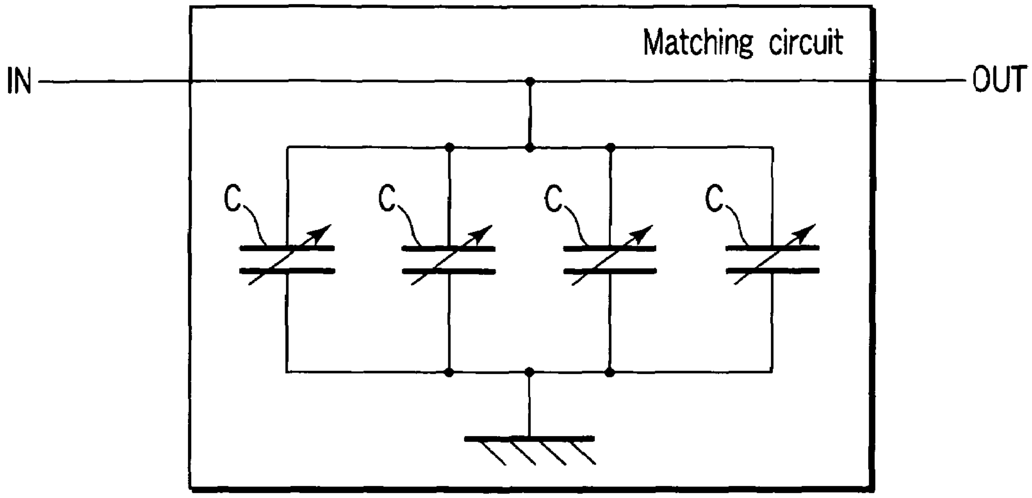
FIG. 23 is a circuit determined showing an example of a matching circuit.

Moreover, as shown in FIGS. 22 and 23, the example of the present invention is applicable to the variable capacity C in a matching circuit of a transmission/reception unit. Furthermore, for example, when a portion surrounded with a broken line is formed into one chip, enhancement of performance and reduction of a mounting dimension can be realized with respect to the system LSI.

Figure 24:
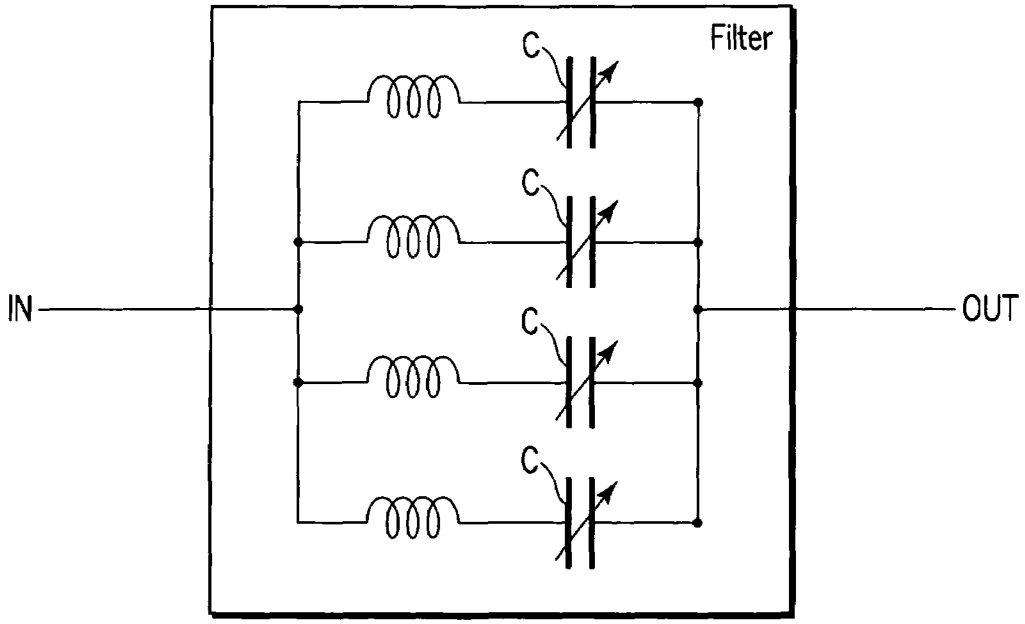
FIG. 24 is a circuit determined showing an example of a filter.

Furthermore, as shown in FIG. 24, the example of the present invention is applicable to the variable capacity C in a filter.

6. OTHERS

It has been described in the above-described embodiments that the cavity is preferably sealed in order to prevent the device destruction by the hydraulic pressure at the dicing time. As to a method of sealing the cavity, in general, a wafer level package is used. In the package, a wafer on which a MEMS element is to be formed is laminated upon a different wafer, but another structure or method may be used. This will be separately proposed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device using a MEMS technology comprising:

a cavity;

a lower electrode provided in a lower part of the cavity;

an actuator provided in an upper part or inside of the cavity;

an upper electrode connected to the actuator; and a conductive layer in contact with the lower electrode outside the cavity via a contact hole whose bottom face is provided above an upper face of the lower electrode in the cavity, wherein a bottom face of the cavity is provided in a lower position than a bottom face of the contact hole, wherein the cavity comprises a groove disposed in an insulating layer, and the lower electrode extends from the top of the insulating layer into the groove, and wherein the insulating layer has a taper or a stairs shape.

2. The semiconductor device according to claim 1, wherein the actuator comprises a first electrode, a piezoelectric layer on the first electrode, and a second electrode on the piezoelectric layer, and a distance between the first electrode and the lower electrode increases as these electrodes come close to the upper electrode in a state in which any voltage is not generated between the first and second electrodes.

3. The semiconductor device according to claim 2, wherein the second electrode is fixed to a ground potential, and an input signal is supplied to the first electrode.

4. The semiconductor device according to claim 2, wherein the piezoelectric layer is one of a ceramic selected from a group consisting of PZT (Pb(Zr,Ti)$O_3$), AlN, ZnO, PbTiO, and BTO($BaTiO_3$), and a polymeric material selected from a group consisting of polyvinylidene fluoride (PVDF).

5. The semiconductor device according to claim 2, wherein the first and second electrode are one of a metal selected from a group consisting of Pt, Sr, Ru, Cr, Mo, W, Ti, Ta, Al, Cu and Ni, an alloy containing at least one of these metals, and a nitride, an oxide or a compound of the metal or the alloy.

6. The semiconductor device according to claim 1, wherein the cavity is sealed.

7. The semiconductor device according to claim 1, wherein the actuator comprises a piezoelectric element.

8. The semiconductor device according to claim 1, wherein the surface of the actuator extending into the cavity is flat in an initial state.

9. The semiconductor device according to claim 1, wherein the lower electrode is fixed to a ground potential.

10. The semiconductor device according to claim 1, wherein the upper electrode and the lower electrode are one of a metal selected from a group consisting of W, Al, Cu, Au, Ti and Pt, an alloy containing at least one of these metals, and a conductive polysilicon containing impurities.

11. A semiconductor device, using a MEMS technology comprising:

a cavity;

a lower electrode provided in a lower part of the cavity;

an actuator provided in an upper part or inside of the cavity;

an upper electrode connected to the actuator; and a conductive layer in contact with the lower electrode outside the cavity via a contact hole whose bottom face is provided above an upper face of the lower electrode in the cavity, wherein a bottom face of the cavity is provided in a lower position than a bottom face of the contact hole, the cavity comprises a groove disposed in an insulating layer, and the lower electrode extends from the top of the insulating layer into the groove, and the insulating layer has a stairs shape.

* * * * *